(12) United States Patent
Brugarolas Brufau et al.

(10) Patent No.: US 9,457,449 B1
(45) Date of Patent: Oct. 4, 2016

(54) CHEMICAL MECHANICAL POLISHING PAD WITH COMPOSITE POLISHING LAYER

(71) Applicant: Rohm and Haas Electronic Materials CMP Holdings, Inc., Newark, DE (US)

(72) Inventors: Teresa Brugarolas Brufau, Philadelphia, PA (US); Julia Kozhukh, Bear, DE (US); Bainian Qian, Newark, DE (US)

(73) Assignee: Rohm and Haas Electronic Materials CMP Holdings, Inc., Newark, DE (US)

( * ) Notice: Subject to any disclaimer, the term of this patent is extended or adjusted under 35 U.S.C. 154(b) by 0 days.

(21) Appl. No.: 14/751,364

(22) Filed: Jun. 26, 2015

(51) Int. Cl.
| | |
|---|---|
| *B24B 37/26* | (2012.01) |
| *H01L 21/302* | (2006.01) |
| *B24B 37/24* | (2012.01) |
| *B24B 37/22* | (2012.01) |
| *B24B 53/017* | (2012.01) |
| *H01L 21/306* | (2006.01) |
| *G02B 1/12* | (2006.01) |
| *H01F 41/00* | (2006.01) |
| *B24B 1/00* | (2006.01) |
| *B24B 37/04* | (2012.01) |
| *B29C 70/66* | (2006.01) |
| *H01L 21/321* | (2006.01) |

(52) U.S. Cl.
CPC .............. *B24B 37/26* (2013.01); *B24B 1/00* (2013.01); *B24B 37/044* (2013.01); *B24B 37/22* (2013.01); *B24B 37/24* (2013.01); *B24B 53/017* (2013.01); *B29C 70/66* (2013.01); *G02B 1/12* (2013.01); *H01F 41/00* (2013.01); *H01L 21/30625* (2013.01); *H01L 21/3212* (2013.01)

(58) Field of Classification Search
None
See application file for complete search history.

(56) References Cited

U.S. PATENT DOCUMENTS

| | | |
|---|---|---|
| 4,500,656 A | 2/1985 | Rasshofer et al. |
| 5,584,146 A | 12/1996 | Shamouillan et al. |
| 5,789,451 A | 8/1998 | Guidetti et al. |
| 5,859,285 A | 1/1999 | Guidetti et al. |
| 6,168,508 B1 | 1/2001 | Nagahara et al. |
| 6,857,941 B2 | 2/2005 | Emami et al. |
| 7,169,030 B1 | 1/2007 | Kulp |
| 7,445,847 B2 | 11/2008 | Kulp |
| 8,075,372 B2 | 12/2011 | Prasad |
| 8,192,257 B2 | 6/2012 | Chandrasekaran et al. |
| 8,288,448 B2 | 10/2012 | Kulp |
| 8,602,851 B2 | 12/2013 | Lombardo et al. |

(Continued)

OTHER PUBLICATIONS

Copending U.S. Appl. No. 14/751,340.

(Continued)

*Primary Examiner* — Jiong-Ping Lu
(74) *Attorney, Agent, or Firm* — Thomas S. Deibert

(57) ABSTRACT

A chemical mechanical polishing pad is provided containing: a polishing layer having a polishing surface; wherein the polishing layer comprises a continuous non-fugitive polymeric phase and a discontinuous non-fugitive polymeric phase; wherein the continuous non-fugitive polymeric phase has a plurality of periodic recesses; wherein the plurality of periodic recesses are occupied with the discontinuous non-fugitive polymeric phase; wherein the continuous non-fugitive polymeric phase has an open cell porosity of ≤6 vol %; wherein the discontinuous non-fugitive polymeric phase contains an open cell porosity of ≥10 vol %; and, wherein the polishing surface is adapted for polishing a substrate.

10 Claims, 8 Drawing Sheets

(56) References Cited

U.S. PATENT DOCUMENTS

| | | |
|---|---|---|
| 8,715,035 B2 | 5/2014 | Roy et al. |
| 2007/0238297 A1 | 10/2007 | Chandrasekaran et al. |
| 2009/0094900 A1 | 4/2009 | Swisher et al. |
| 2014/0227951 A1 | 8/2014 | Lin et al. |
| 2016/0089764 A1* | 3/2016 | Feng ................ B24B 37/26 51/297 |

OTHER PUBLICATIONS

Copending U.S. Appl. No. 14/751,350.
Copending U.S. Appl. No. 14/751,364.
Copending U.S. Appl. No. 14/751,410.
Copending U.S. Appl. No. 14/751,423.
Copending U.S. Appl. No. 14/751,385.
Copending U.S. Appl. No. 14/751,328.

* cited by examiner

CHEMICAL MECHANICAL POLISHING PAD WITH COMPOSITE POLISHING LAYER

The present invention relates to a chemical mechanical polishing pad. More particularly, the present invention relates to a chemical mechanical polishing pad containing a polishing layer having a polishing surface; wherein the polishing layer comprises a continuous non-fugitive polymeric phase and a discontinuous non-fugitive polymeric phase; wherein the continuous non-fugitive polymeric phase has a plurality of periodic recesses; wherein the plurality of periodic recesses are occupied with the discontinuous non-fugitive polymeric phase; wherein the continuous non-fugitive polymeric phase has an open cell porosity of ≤6 vol %; wherein the discontinuous non-fugitive polymeric phase contains an open cell porosity of ≥10 vol %; and, wherein the polishing surface is adapted for polishing a substrate.

In the fabrication of integrated circuits and other electronic devices, multiple layers of conducting, semiconducting and dielectric materials are deposited onto and removed from a surface of a semiconductor wafer. Thin layers of conducting, semiconducting and dielectric materials may be deposited using a number of deposition techniques. Common deposition techniques in modern wafer processing include physical vapor deposition (PVD), also known as sputtering, chemical vapor deposition (CVD), plasma-enhanced chemical vapor deposition (PECVD) and electrochemical plating, among others. Common removal techniques include wet and dry isotropic and anisotropic etching, among others.

As layers of materials are sequentially deposited and removed, the uppermost surface of the wafer becomes non-planar. Because subsequent semiconductor processing (e.g., metallization) requires the wafer to have a flat surface, the wafer needs to be planarized. Planarization is useful for removing undesired surface topography and surface defects, such as rough surfaces, agglomerated materials, crystal lattice damage, scratches and contaminated layers or materials.

Chemical mechanical planarization, or chemical mechanical polishing (CMP), is a common technique used to planarize or polish work pieces such as semiconductor wafers. In conventional CMP, a wafer carrier, or polishing head, is mounted on a carrier assembly. The polishing head holds the wafer and positions the wafer in contact with a polishing layer of a polishing pad that is mounted on a table or platen within a CMP apparatus. The carrier assembly provides a controllable pressure between the wafer and polishing pad. Simultaneously, a polishing medium (e.g., slurry) is dispensed onto the polishing pad and is drawn into the gap between the wafer and polishing layer. To effect polishing, the polishing pad and wafer typically rotate relative to one another. As the polishing pad rotates beneath the wafer, the wafer sweeps out a typically annular polishing track, or polishing region, wherein the wafer's surface directly confronts the polishing layer. The wafer surface is polished and made planar by chemical and mechanical action of the polishing layer and polishing medium on the surface.

James et al. disclose the importance of grooving in the polishing surface of chemical mechanical polishing pads in U.S. Pat. No. 6,736,709. Specifically, James et al. teach that the "Groove Stiffness Quotient" ("GSQ") estimates the effects of grooving on pad stiffness and the "Groove Flow Quotient" ("GFQ") estimates the effects of grooving on (pad interface) fluid flow; and that there is a delicate balance between the GSQ and GFQ in selecting an ideal polishing surface for a given polishing process.

Notwithstanding, as wafer dimension continue to shrink the demands of the associated polishing processes are becoming evermore intense.

Accordingly, there is a continuing need for polishing layer designs that expand the operating performance range of chemical mechanical polishing pads.

The present invention provides a chemical mechanical polishing pad, comprising: a polishing layer having a polishing surface, a base surface and an average thickness, $T_{P\text{-}avg}$, measured normal to the polishing surface from the base surface to the polishing surface; wherein the polishing layer comprises a continuous non-fugitive polymeric phase and a discontinuous non-fugitive polymeric phase; wherein the continuous non-fugitive polymeric phase has a plurality of periodic recesses having an average recess depth, $D_{avg}$, measured normal to the polishing surface from the polishing surface toward the base surface; wherein the average recess depth, $D_{avg}$, is less than the average thickness, $T_{P\text{-}avg}$; wherein the plurality of periodic recesses are occupied with the discontinuous non-fugitive polymeric phase; wherein the continuous non-fugitive polymeric phase has an open cell porosity of ≤6 vol %; wherein the discontinuous non-fugitive polymeric phase contains an open cell porosity of ≥10 vol %; and, wherein the polishing surface is adapted for polishing a substrate.

The present invention provides a chemical mechanical polishing pad, comprising: a polishing layer having a polishing surface, a base surface and an average thickness, $T_{P\text{-}avg}$, measured normal to the polishing surface from the base surface to the polishing surface; wherein the polishing layer comprises a continuous non-fugitive polymeric phase and a discontinuous non-fugitive polymeric phase; wherein the continuous non-fugitive polymeric phase has a plurality of periodic recesses having an average recess depth, $D_{avg}$, measured normal to the polishing surface from the polishing surface toward the base surface; wherein the average recess depth, $D_{avg}$, is less than the average thickness, $T_{P\text{-}avg}$; wherein the plurality of periodic recesses are occupied with the discontinuous non-fugitive polymeric phase; wherein the discontinuous non-fugitive polymeric phase occupying the plurality of periodic recesses has an average height, $H_{avg}$, measured normal to the polishing surface from the base surface of the polishing layer toward the polishing surface; wherein an absolute value of a difference, $\Delta S$, between the average thickness, $T_{P\text{-}avg}$, and the average height, $H_{avg}$, is ≤0.5 µm; wherein the continuous non-fugitive polymeric phase has an open cell porosity of ≤6 vol %; wherein the discontinuous non-fugitive polymeric phase contains an open cell porosity of ≥10 vol %; and, wherein the polishing surface is adapted for polishing a substrate.

The present invention provides a method of polishing a substrate, comprising: providing a substrate selected from at least one of a magnetic substrate, an optical substrate and a semiconductor substrate; providing a chemical mechanical polishing pad according to the present invention; creating dynamic contact between a polishing surface of the polishing layer and the substrate to polish a surface of the substrate; and, conditioning of the polishing surface with an abrasive conditioner.

DETAILED DESCRIPTION

Historically, the GSQ and GFQ values for a polishing surface of a given polishing layer provided a workable range within which to design effective polishing layers. Surprisingly, the present invention provides a means for breaking the mold of heretofore established GSQ and GFQ parameters for polishing layers by decoupling the polishing layer stiffness and slurry distribution performance of polishing layer designs; thereby expanding the range of polishing layer designs to heretofore unobtainable balances of polishing performance properties.

The term "non-fugitive" as used herein and in the appended claims in reference to a polymeric phase means that the polymeric phase (e.g., the discontinuous non-fugitive polymeric phase) does not melt, dissolve, disintegrate or otherwise deplete selectively relative to another polymer phase (e.g., the continuous non-fugitive polymeric phase) present in the polishing layer.

Figure 3:
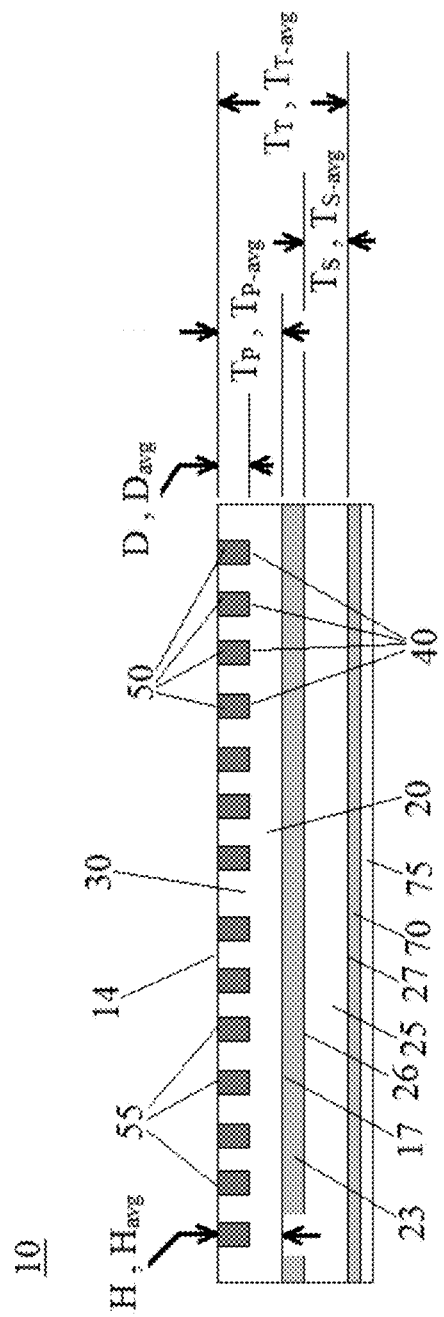
FIG. 3 is a depiction of a cross sectional view of a chemical mechanical polishing pad of the present invention taken along line A-A in FIG. 2.
Figure 4:
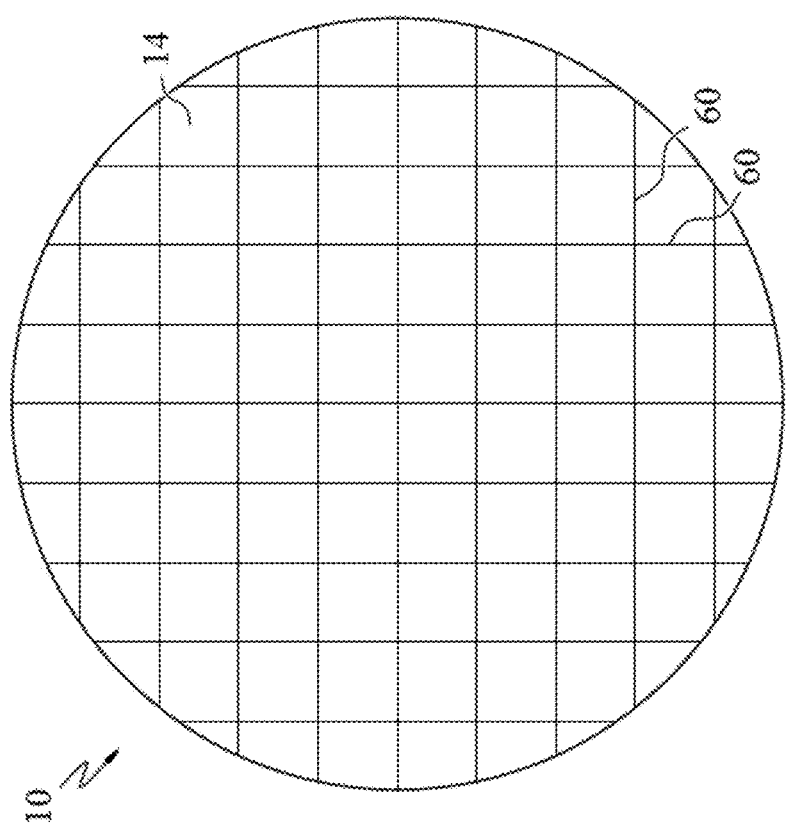
FIG. 4 is a depiction of a top plan view of a chemical mechanical polishing pad of the present invention.
Figure 5:
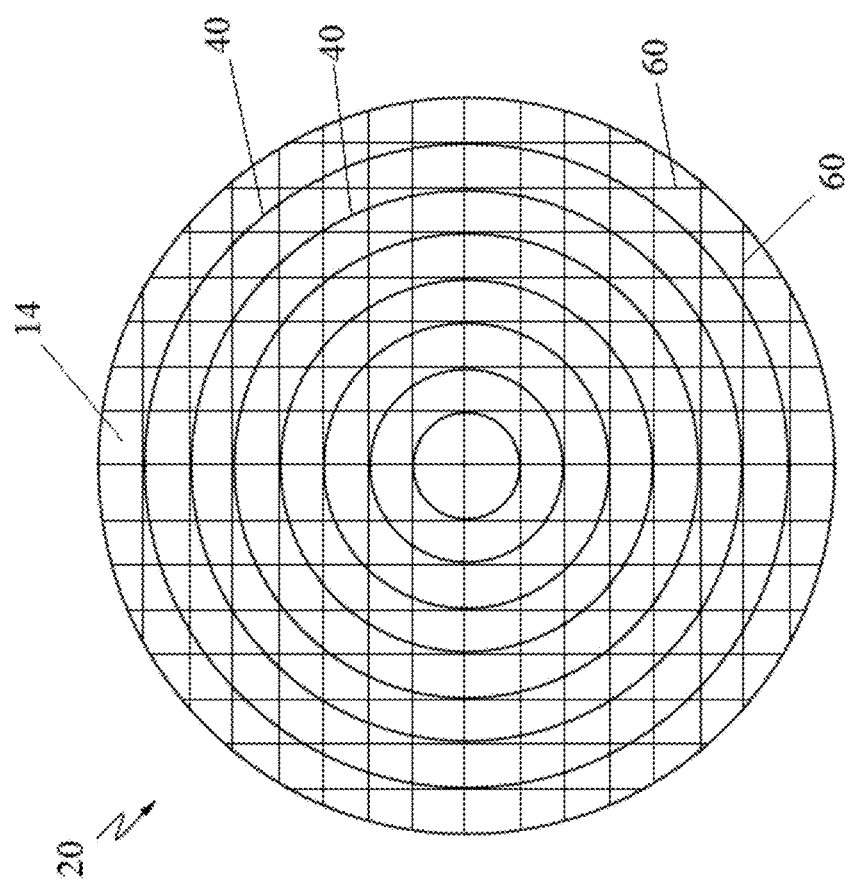
FIG. 5 is a depiction of a top plan view of a polishing layer of the present invention.
Figure 6:
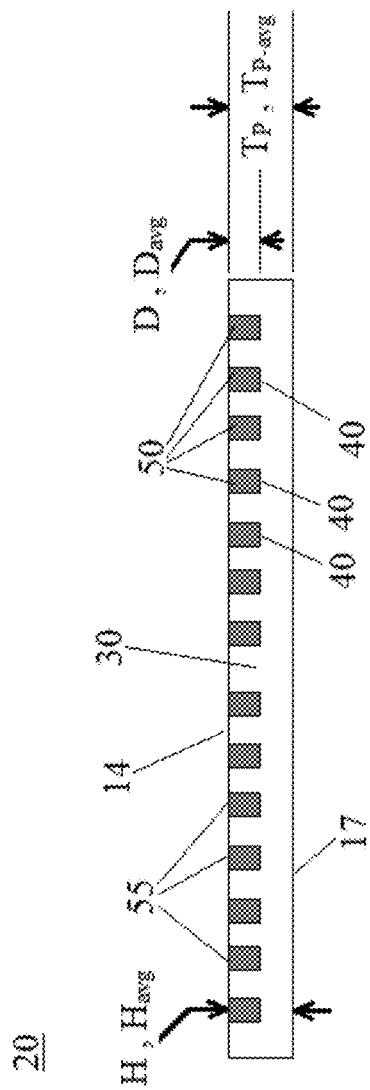
FIG. 6 is a depiction of a side elevational view of a cross section of a polishing layer of the present invention.
Figure 7:
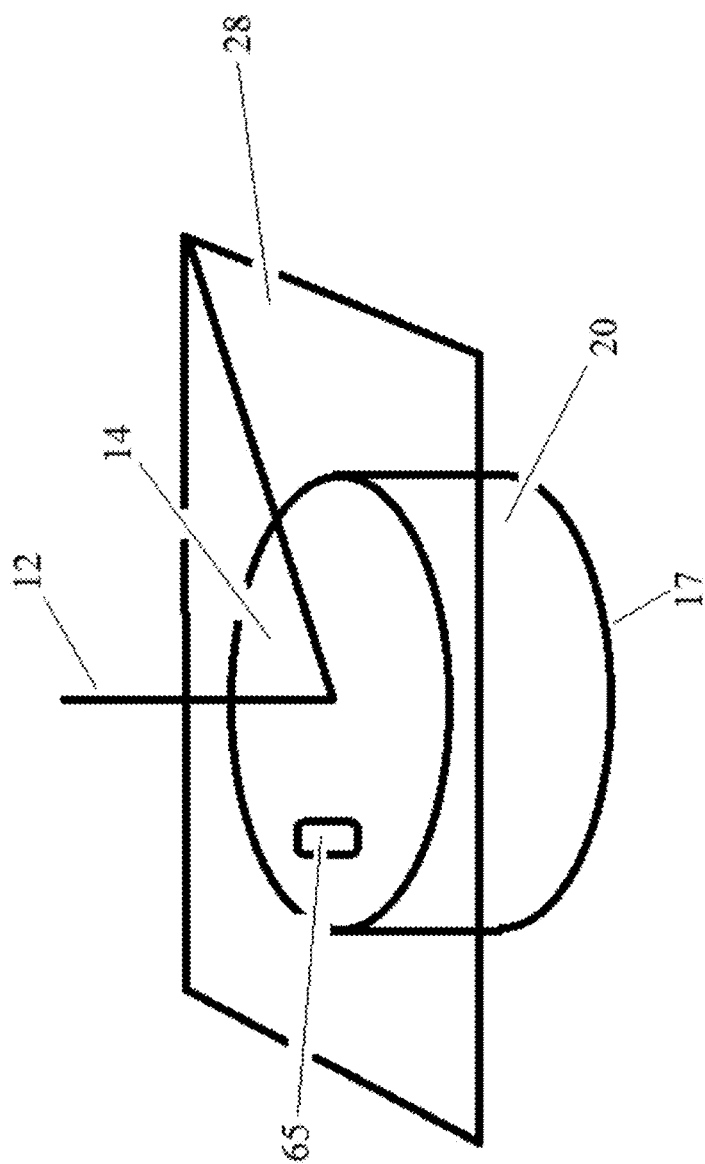
FIG. 7 is a depiction of a side perspective view of a polishing layer of the present invention.

The term "average total thickness, $T_{T\text{-}avg}$" as used herein and in the appended claims in reference to a chemical mechanical polishing pad (10) having a polishing surface (14) means the average thickness, $T_T$, of the chemical mechanical polishing pad measured normal to the polishing surface (14) from the polishing surface (14) to the bottom surface (27) of the subpad (25). (See FIG. 3).

Figure 1:
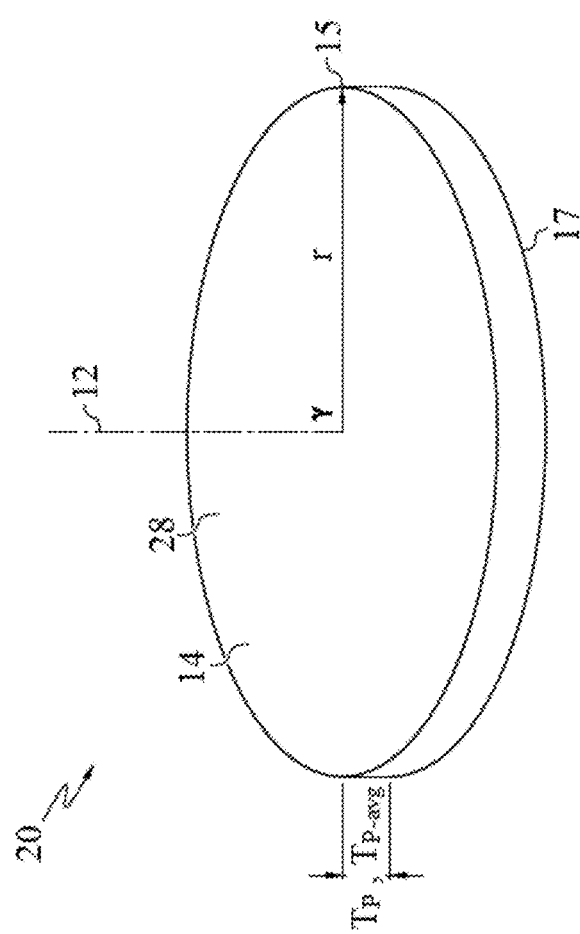
FIG. 1 is a depiction of a perspective view of a polishing layer of the present invention.

The term "substantially circular cross section" as used herein and in the appended claims in reference to a polishing layer (20) means that the longest radius, r, of the cross section from the central axis (12) to the outer perimeter (15) of the polishing surface (14) of the polishing layer (20) is ≤20% longer than the shortest radius, r, of the cross section from the central axis (12) to the outer perimeter (15) of the polishing surface (14). (See FIG. 1).

The chemical mechanical polishing pad (10) of the present invention is preferably adapted for rotation about a central axis (12). (See FIG. 1). Preferably, the polishing surface (14) of polishing layer (20) is in a plane (28) perpendicular to the central axis (12). The chemical mechanical polishing pad (10) is optionally adapted for rotation in a plane (28) that is at an angle, γ, of 85 to 95° to the central axis (12), preferably, of 90° to the central axis (12). Preferably, the polishing layer (20) has a polishing surface (14) that has a substantially circular cross section perpendicular to the central axis (12). Preferably, the radius, r, of the cross section of the polishing surface (14) perpendicular to the central axis (12) varies by ≤20% for the cross section, more preferably by ≤10% for the cross section.

The term "polishing medium" as used herein and in the appended claims encompasses particle containing polishing solutions and nonparticle containing polishing solutions, such as abrasive free and reactive liquid polishing solutions.

The term "chemical bond" as used herein and in the appended claims refers to attractive forces between atoms and encompasses covalent bonds, ionic bonds, metallic bonds, hydrogen bonds and van der Walls forces.

The term "poly(urethane)" as used herein and in the appended claims encompasses (a) polyurethanes formed from the reaction of (i) isocyanates and (ii) polyols (including diols); and, (b) poly(urethane) formed from the reaction of (i) isocyanates with (ii) polyols (including diols) and (iii) water, amines (including diamines and polyamines) or a combination of water and amines (including diamines and polyamines).

Preferably, the chemical mechanical polishing pad (10) of the present invention is specifically designed to facilitate the polishing of a substrate selected from at least one of a magnetic substrate, an optical substrate and a semiconductor substrate. More preferably, the chemical mechanical polishing pad (10) of the present invention is specifically designed to facilitate the polishing of a semiconductor substrate. Most preferably, the chemical mechanical polishing pad (10) of the present invention is specifically designed to facilitate the polishing of a semiconductor substrate, wherein the semiconductor substrate is a semiconductor wafer.

Preferably, the chemical mechanical polishing pad (10) of the present invention, comprises: a polishing layer (20) having a polishing surface (14), a base surface (17) and an average thickness, $T_{P\text{-}avg}$, measured normal to the polishing surface (14) from the base surface (17) to the polishing surface (14); wherein the polishing layer (20) comprises a continuous non-fugitive polymeric phase (30) and a discontinuous non-fugitive polymeric phase (50); wherein the continuous non-fugitive polymeric phase (30) has a plurality of periodic recesses (40); wherein the continuous non-fugitive polymeric phase (30) has a plurality of periodic recesses (40) having an average recess depth, $D_{avg}$, measured normal to the polishing surface (14) from the polishing surface (14) toward the base surface (17); wherein the average recess depth, $D_{avg}$, is less than the average thickness, $T_{P\text{-}avg}$ (preferably, wherein $D_{avg} \leq 0.5*T_{P\text{-}avg}$; more preferably, wherein $D_{avg} \leq 0.4*T_{P\text{-}avg}$; most preferably, wherein $D_{avg} \leq 0.375*T_{P\text{-}avg}$); wherein the plurality of periodic recesses (40) are occupied with the discontinuous non-fugitive polymeric phase (50); optionally, wherein the continuous non-fugitive polymeric phase (30) contains a plurality of hollow core polymeric materials; wherein the plurality of hollow core polymeric materials is incorporated in the continuous non-fugitive polymeric phase (30) at 0 to 58 vol %; wherein the continuous non-fugitive polymeric phase (30) has an open cell porosity of ≤6 vol % (preferably, ≤5 vol %; more preferably, ≤4 vol %; most preferably, ≤3 vol %); wherein the discontinuous non-fugitive polymeric phase (50) contains an open cell porosity of ≥10 vol % (preferably, of 25 to 75 vol %; more preferably, 30 to 60 vol %; most preferably, 45 to 55 vol %); and, wherein the polishing surface is adapted for polishing a substrate. (See FIGS. 1-8).

Preferably, the continuous non-fugitive polymeric phase (30) in the polishing layer (20) of the chemical mechanical polishing pad (10) of the present invention comprises a polymer. More preferably, the continuous non-fugitive polymeric phase (30) in the polishing layer (20) of the chemical mechanical polishing pad (10) of the present invention comprises a polymer selected from the group consisting of polycarbonates, polysulfones, nylons, polyethers, polyesters, polystyrenes, acrylic polymers, polymethyl methacrylates, polyvinylchlorides, polyvinylfluorides, polyethylenes, polypropylenes, polybutadienes, polyethylene imines, poly(urethanes), polyether sulfones, polyamides, polyether imides, polyketones, epoxies, silicones and combinations thereof. Most preferably, the continuous non-fugitive polymeric phase (30) in the polishing layer (20) of the chemical mechanical polishing pad (10) of the present invention comprises a poly(urethane).

Preferably, the continuous non-fugitive polymeric phase (30) in the polishing layer (20) of the chemical mechanical polishing pad (10) of the present invention can be provided in both porous and nonporous (i.e., unfilled) configurations. Preferably, the continuous non-fugitive polymeric phase (30) in the polishing layer (20) of the chemical mechanical polishing pad (10) of the present invention has a specific gravity of ≥0.5 as measured according to ASTM D1622. More preferably, the continuous non-fugitive polymeric phase (30) in the polishing layer (20) of the chemical mechanical polishing pad (10) of the present invention has a specific gravity of 0.5 to 1.2 (still more preferably, 0.55 to 1.1; most preferably 0.6 to 0.95) as measured according to ASTM D1622.

Preferably, the continuous non-fugitive polymeric phase (30) in the polishing layer (20) of the chemical mechanical polishing pad (10) of the present invention has a Shore D hardness of 5 to 90 as measured according to ASTM D2240. More preferably, the continuous non-fugitive polymeric phase (30) in the polishing layer (20) of the chemical mechanical polishing pad (10) of the present invention has a Shore D hardness of 35 to 70 as measured according to ASTM D2240. Most preferably, the continuous non-fugitive polymeric phase (30) in the polishing layer (20) of the chemical mechanical polishing pad (10) has a Shore D hardness of 40 to 65 as measured according to ASTM D2240.

Preferably, the continuous non-fugitive polymeric phase (30) in the polishing layer (20) of the chemical mechanical polishing pad (10) is porous. Preferably, the continuous non-fugitive polymeric phase comprises a plurality of microelements. Preferably, the plurality of microelements are uniformly dispersed throughout the continuous non-fugitive polymeric phase (30) in the polishing layer (20) of the chemical mechanical polishing pad (10). Preferably, the plurality of microelements is selected from entrapped gas bubbles, hollow core polymeric materials, liquid filled hollow core polymeric materials, water soluble materials and an insoluble phase material (e.g., mineral oil). More preferably, the plurality of microelements is selected from entrapped gas bubbles and hollow core polymeric materials uniformly distributed throughout the continuous non-fugitive polymeric phase (30). Preferably, the plurality of microelements has a weight average diameter of less than 150 µm (more preferably of less than 50 µm; most preferably of 10 to 50 µm). Preferably, the plurality of microelements comprise polymeric microballoons with shell walls of either polyacrylonitrile or a polyacrylonitrile copolymer (e.g., Expancel® from Akzo Nobel). Preferably, the plurality of microelements are incorporated into the continuous non-fugitive polymeric phase (30) in the polishing layer (20) of the chemical mechanical polishing pad (10) at 0 to 58 vol % porosity (more preferably, 1 to 58 vol %; most preferably, 10 to 35 vol % porosity). Preferably, the continuous non-fugitive polymeric phase (30) in the polishing layer (20) of the chemical mechanical polishing pad (10) has an open cell porosity of ≤6 vol % (more preferably, ≤5 vol %; still more preferably, ≤4 vol %; most preferably, ≤3 vol %).

Preferably, the discontinuous non-fugitive polymeric phase (50) in the polishing layer (20) of the chemical mechanical polishing pad (10) of the present invention comprises a polymer. More preferably, the discontinuous non-fugitive polymeric phase (50) in the polishing layer (20) of the chemical mechanical polishing pad (10) of the present invention comprises a polymer selected from the group consisting of polycarbonates, polysulfones, nylons, polyethers, polyesters, polystyrenes, acrylic polymers, polymethyl methacrylates, polyvinylchlorides, polyvinylfluorides, polyethylenes, polypropylenes, polybutadienes, polyethylene imines, poly(urethanes), polyether sulfones, polyamides, polyether imides, polyketones, epoxies, silicones and combinations thereof. Most preferably, the discontinuous non-fugitive polymeric phase (50) in the polishing layer (20) of the chemical mechanical polishing pad (10) of the present invention comprises a poly(urethane).

Preferably, the discontinuous non-fugitive polymeric phase (50) in the polishing layer (20) of the chemical mechanical polishing pad (10) has a Shore D hardness of 10 to 70 as measured according to ASTM D2240. More preferably, the discontinuous non-fugitive polymeric phase (50) in the polishing layer (20) of the chemical mechanical polishing pad (10) has a Shore D hardness of 20 to 60 (still more preferably 25 to 55; most preferably 40 to 50) as measured according to ASTM D2240.

Preferably, the discontinuous non-fugitive polymeric phase (50) in the polishing layer (20) of the chemical mechanical polishing pad (10) of the present invention has an open cell porosity of ≥10 vol %. More preferably, the discontinuous non-fugitive polymeric phase (50) in the polishing layer (20) of the chemical mechanical polishing pad (10) of the present invention has an open cell porosity of 25 to 75 vol % (more preferably, 30 to 60 vol %; most preferably, 45 to 55 vol %).

Preferably, the discontinuous non-fugitive polymer phase (50) is provided in the polishing layer (20) of the chemical mechanical polishing pad (10) of the present invention in at least two disconnected portions. More preferably, the discontinuous non-fugitive polymer phase (50) is provided in the polishing layer (20) of the chemical mechanical polishing pad (10) of the present invention in at least three disconnected portions.

Preferably, the continuous non-fugitive polymeric phase (30) in the chemical mechanical polishing pad (10) of the present invention has a plurality of periodic recesses (40) having a recess depth, D, measured normal to the polishing surface (14) from the polishing surface (14) toward the base surface. Preferably, the plurality of periodic recesses (40) have an average recess depth, $D_{avg}$; wherein $D_{avg} < T_{P-avg}$. More preferably, the plurality of periodic recesses (40) have an average recess depth, $D_{avg}$; wherein $D_{avg} \leq 0.5*T_{P-avg}$ (more preferably, $D_{avg} \leq 0.4*T_{P-avg}$; most preferably, $D_{avg} \leq 0.375*T_{P-avg}$). (See FIGS. 3 and 6).

Figure 2:
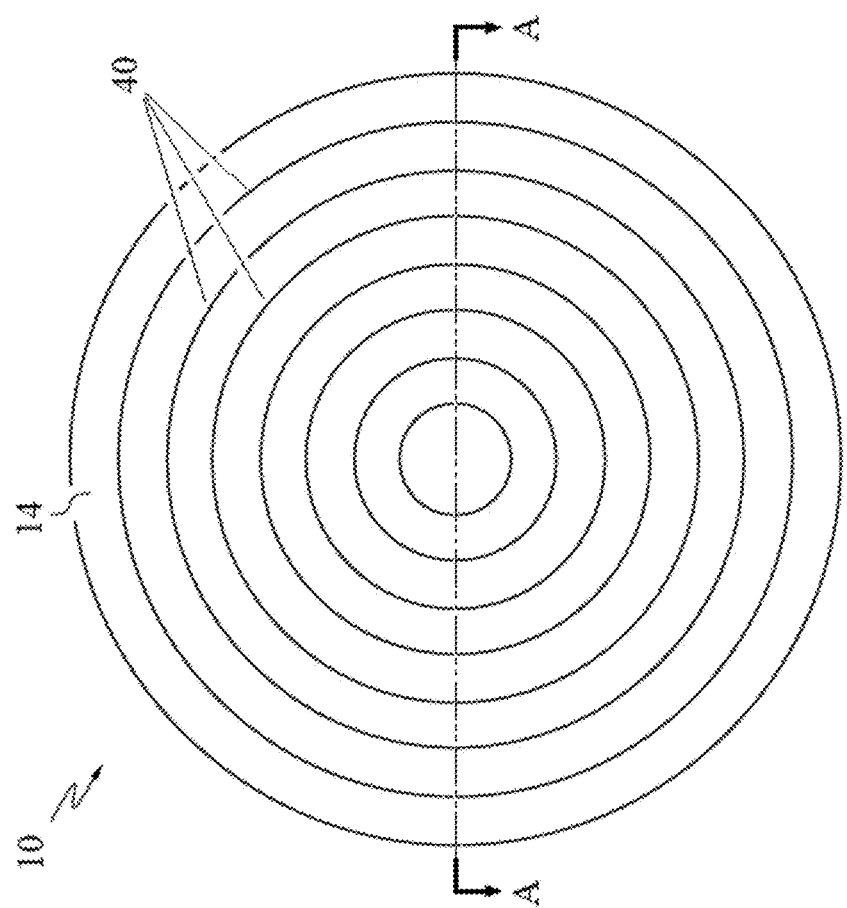
FIG. 2 is a depiction of a top plan view of a chemical mechanical polishing pad of the present invention.
Figure 8:
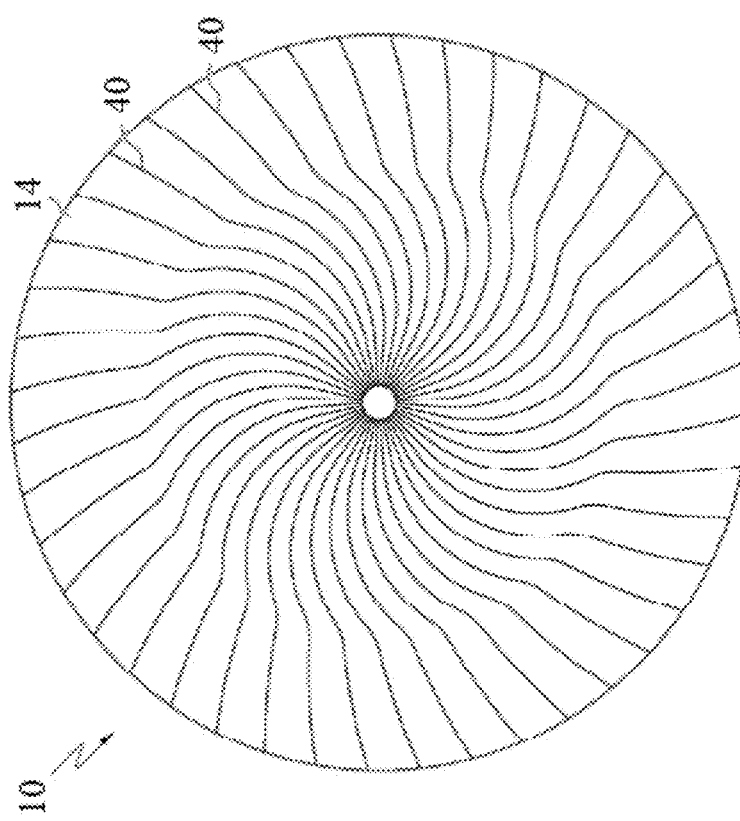
FIG. 8 is a depiction of a top plan view of a chemical mechanical polishing pad of the present invention.

Preferably, the plurality of periodic recesses (40) are selected from curved recesses, linear recesses and combinations thereof (See FIGS. 2 and 8).

Preferably, the continuous non-fugitive polymeric phase (30) in the chemical mechanical polishing pad (10) of the present invention has a plurality of periodic recesses (40), wherein the plurality of periodic recesses is a group of at least two concentric recesses. (See, e.g., FIGS. 2 and 5). Preferably, the at least two concentric recesses have an average recess depth, $D_{avg}$, of ≥15 mils (preferably, 15 to 40 mils; more preferably, 25 to 35 mils; most preferably, 30 mils), a width of ≥5 mils (preferably, 5 to 150 mils; more preferably, 10 to 100 mils; most preferably, 15 to 50 mils) and a pitch of ≥10 mils (preferably, 25 to 150 mils; more preferably, 50 to 100 mils; most preferably, 60 to 80 mils).

Preferably, the at least two concentric recesses have a width and a pitch, wherein the width and pitch are equal.

Preferably, the continuous non-fugitive polymeric phase (30) in the chemical mechanical polishing pad (10) of the present invention has a plurality of periodic recesses (40), wherein the plurality of periodic recesses is a group of at least two cross-hatched recesses; wherein the plurality of periodic recesses are dissected by at least one groove.

Preferably, the discontinuous non-fugitive polymeric phase (50) occupying the plurality of periodic recesses (40) in the chemical mechanical polishing pad (10) of the present invention has a height, H, measured normal to the polishing surface (14) from the base surface (17) of polishing layer (20) toward the polishing surface (14). Preferably, the discontinuous non-fugitive polymeric phase (50) occupying the plurality of periodic recesses (40) has an average height, $H_{avg}$, measured normal to the polishing surface (14) from the base surface (17) of polishing layer (20) toward the polishing surface (14); wherein the absolute value of the difference, $\Delta S$, between the average thickness, $T_{P-avg}$, of the polishing layer (20) and the average height, $H_{avg}$, of the discontinuous non-fugitive polymeric phase (50) is ≤0.5 μm. More preferably, the discontinuous non-fugitive polymeric phase (50) occupying the plurality of periodic recesses (40) has an average height, $H_{avg}$, measured normal to the polishing surface (14) from the base surface (17) of polishing layer (20) toward the polishing surface (14); wherein the absolute value of the difference, $\Delta S$, between the average thickness, $T_{P-avg}$, of the polishing layer (20) and the average height, $H_{avg}$, of the discontinuous non-fugitive polymeric phase (50) is ≤0.2 μm. Still more preferably, the discontinuous non-fugitive polymeric phase (50) occupying the plurality of periodic recesses (40) has an average height, $H_{avg}$, measured normal to the polishing surface (14) from the base surface (17) of polishing layer (20) toward the polishing surface (14); wherein the absolute value of the difference, $\Delta S$, between the average thickness, $T_{P-avg}$, of the polishing layer (20) and the average height, $H_{avg}$, of the discontinuous non-fugitive polymeric phase (50) is ≤0.1 μm. Most preferably, the discontinuous non-fugitive polymeric phase (50) occupying the plurality of periodic recesses (40) has an average height, $H_{avg}$, measured normal to the polishing surface (14) from the base surface (17) of polishing layer (20) toward the polishing surface (14); wherein the absolute value of the difference, $\Delta S$, between the average thickness, $T_{P-avg}$, of the polishing layer (20) and the average height, $H_{avg}$, of the discontinuous non-fugitive polymeric phase (50) is ≤0.05 μm. (See FIGS. 3 and 6).

Preferably, the discontinuous non-fugitive polymeric phase (50) occupies the plurality of periodic recesses (40) in the continuous non-fugitive polymeric phase (30), wherein there are chemical bonds between the continuous non-fugitive polymeric phase (30) and the discontinuous non-fugitive polymeric phase (50). More preferably, the discontinuous non-fugitive polymeric phase (50) occupies the plurality of periodic recesses (40) in the continuous non-fugitive polymeric phase (30), wherein there are covalent bonds between the continuous non-fugitive polymeric phase (30) and the discontinuous non-fugitive polymeric phase (50) such that the phases cannot be separated unless the covalent bonds between the phases are broken.

One of ordinary skill in the art will understand to select a polishing layer (20) having a thickness, $T_P$, suitable for use in a chemical mechanical polishing pad (10) for a given polishing operation. Preferably, the polishing layer (20) exhibits an average thickness, $T_{P-avg}$, along an axis (12) perpendicular to a plane (28) of the polishing surface (14). More preferably, the average thickness, $T_{P-avg}$, is 20 to 150 mils (more preferably, 30 to 125 mils; most preferably, 40 to 120 mils). (See FIGS. 1, 3 and 6).

Preferably, the polishing surface (14) of the polishing layer (20) of the chemical mechanical polishing pad (10) of the present invention is adapted for polishing a substrate selected from at least one of a magnetic substrate, an optical substrate and a semiconductor substrate (more preferably, a semiconductor substrate; most preferably, a semiconductor wafer). The polishing surface (14) of the polishing layer (20) has at least one of macrotexture and microtexture to facilitate polishing the substrate. Preferably, the polishing surface (14) has macrotexture, wherein the macrotexture is designed to do at least one of (i) alleviate at least one of hydroplaning; (ii) influence polishing medium flow; (iii) modify the stiffness of the polishing layer; (iv) reduce edge effects; and, (v) facilitate the transfer of polishing debris away from the area between the polishing surface (14) and the substrate being polished.

Preferably, the polishing layer (20) in the chemical mechanical polishing pad (10) of the present invention, further comprises: at least one of at least one of perforations (not shown) and grooves (60). More preferably, the polishing layer (20) of the chemical mechanical polishing pad (10) of the present invention has at least one groove (60) formed in the polishing layer (20) opening at the polishing surface (14). Preferably, the at least one groove (60) is arranged on the polishing surface (14) such that upon rotation of the chemical mechanical polishing pad (10) during polishing, at least one groove (60) sweeps over the substrate. Preferably, the at least one groove (60) is selected from curved grooves, linear grooves and combinations thereof. Preferably, the at least one groove (60) has a groove depth, $G_{depth}$, of ≥10 mils (preferably, 10 to 150 mils). Preferably, the at least one groove (60) forms a groove pattern that comprises at least two grooves having a combination of a groove depth, $G_{depth}$, selected from ≥10 mils, ≥15 mils and 15 to 150 mils; a width selected from ≥10 mils and 10 to 100 mils; and a pitch selected from ≥30 mils, ≥50 mils, 50 to 200 mils, 70 to 200 mils, and 90 to 200 mils. Preferably, the at least one groove (60) is selected from (a) at least two concentric grooves; (b) at least one spiral groove; (c) a cross hatch groove pattern; and (d) a combination thereof. (See FIGS. 4-5).

Preferably, the polishing layer (20) of the chemical mechanical polishing pad (10) of the present invention has <0.2 wt % abrasive particles incorporated therein. More preferably, the polishing layer (20) of the chemical mechanical polishing pad (10) of the present invention has <1 ppm abrasive particles incorporated therein.

Preferably, the chemical mechanical polishing pad (10) of the present invention further comprises a subpad (25). Preferably, the subpad (25) is made of a material selected from the group consisting of an open cell foam, a closed cell foam, a woven material, a nonwoven material (e.g., felted, spun bonded, and needle punched materials), and, combinations thereof. One of ordinary skill in the art will know to select an appropriate material of construction and thickness, $T_S$, for use as a subpad (25). Preferably, the subpad (25) has an average subpad thickness, $T_{S-avg}$, of ≥15 mils (more preferably, 30 to 100 mils; most preferably 30 to 75 mils). (See FIG. 3).

One of ordinary skill in the art will know how to select an appropriate stack adhesive (23) for use in the chemical mechanical polishing pad (10). Preferably, the stack adhesive (23) is a hot melt adhesive. More preferably, the stack adhesive (23) is a reactive hot melt adhesive. Still more preferably, the hot melt adhesive (23) is a cured reactive hot melt adhesive that exhibits a melting temperature in its uncured state of 50 to 150° C., preferably of 115 to 135° C. and exhibits a pot life of ≤90 minutes after melting. Most preferably, the reactive hot melt adhesive (23) in its uncured state comprises a polyurethane resin (e.g., Mor-Melt™ R5003 available from The Dow Chemical Company).

Preferably, the chemical mechanical polishing pad (10) of the present invention is adapted to be interfaced with a platen of a polishing machine. Preferably, the chemical mechanical polishing pad (10) is adapted to be affixed to the platen of a polishing machine. More preferably, the chemical mechanical polishing pad (10) can be affixed to the platen using at least one of a pressure sensitive adhesive and vacuum.

Preferably, the chemical mechanical polishing pad (10) includes a pressure sensitive platen adhesive (70) applied to the bottom surface (27) of the subpad (25). One of ordinary skill in the art will know how to select an appropriate pressure sensitive adhesive for use as the pressure sensitive platen adhesive (70). Preferably, the chemical mechanical polishing pad (10) will also include a release liner (75) applied over the pressure sensitive platen adhesive (70), wherein the pressure sensitive platen adhesive (70) is interposed between the bottom surface (27) of the rigid layer (25) and the release liner (75). (See FIG. 3).

An important step in substrate polishing operations is determining an endpoint to the process. One popular in situ method for endpoint detection involves providing a polishing pad with a window, which is transparent to select wavelengths of light. During polishing, a light beam is directed through the window to the wafer surface, where it reflects and passes back through the window to a detector (e.g., a spectrophotometer). Based on the return signal, properties of the substrate surface (e.g., the thickness of films thereon) can be determined for endpoint detection. To facilitate such light based endpoint methods, the chemical mechanical polishing pad (10) of the present invention, optionally further comprises an endpoint detection window (65). Preferably, the endpoint detection window (65) is selected from an integral window incorporated into the polishing layer (20); and, a plug in place endpoint detection window block incorporated into the chemical mechanical polishing pad (10). One of ordinary skill in the art will know to select an appropriate material of construction for the endpoint detection window for use in the intended polishing process. (See FIG. 7).

Preferably, the method of polishing a substrate of the present invention, comprises: providing a substrate selected from at least one of a magnetic substrate, an optical substrate and a semiconductor substrate (preferably a semiconductor substrate; more preferably, a semiconductor substrate, wherein the semiconductor substrate is a semiconductor wafer); providing a chemical mechanical polishing pad according to the present invention; creating dynamic contact between a polishing surface of the polishing layer and the substrate to polish a surface of the substrate; and, conditioning of the polishing surface with an abrasive conditioner. More preferably, in the method of polishing a substrate of the present invention, the continuous non-fugitive polymeric phase (30) and the discontinuous non-fugitive polymeric phase (50) wear evenly from the polishing surface (14) of the polishing layer (20). Most preferably, in the method of polishing a substrate of the present invention, the continuous non-fugitive polymeric phase (30) and the discontinuous non-fugitive polymeric phase (50) wear at substantially the same rate from the polishing surface (14) of the polishing layer (20) such that the absolute value of the difference, ΔS, between the average thickness, $T_{P\text{-}avg}$, of the polishing layer (20) and the average height, $H_{avg}$, of the discontinuous non-fugitive polymeric phase (50) remains ≤0.5 μm (preferably, ≤0.2 μm; more preferably, ≤0.1 μm; most preferably, ≤0.05 μm) throughout the useful lifetime of the chemical mechanical polishing pad (10).

We claim:

1. A chemical mechanical polishing pad, comprising:
   a polishing layer having a polishing surface, a base surface and an average thickness, $T_{P\text{-}avg}$, measured normal to the polishing surface from the base surface to the polishing surface;
   wherein the polishing layer comprises a continuous non-fugitive polymeric phase and a discontinuous non-fugitive polymeric phase;
   wherein the continuous non-fugitive polymeric phase has a plurality of periodic recesses having an average recess depth, $D_{avg}$, measured normal to the polishing surface from the polishing surface toward the base surface;
   wherein the average recess depth, $D_{avg}$, is less than the average thickness, $T_{P\text{-}avg}$;
   wherein the plurality of periodic recesses are occupied with the discontinuous non-fugitive polymeric phase;
   wherein the continuous non-fugitive polymeric phase has an open cell porosity of ≤6 vol %;
   wherein the discontinuous non-fugitive polymeric phase contains an open cell porosity of ≥10 vol %; and,
   wherein the polishing surface is adapted for polishing a substrate.

2. The chemical mechanical polishing pad of claim 1, wherein the discontinuous non-fugitive polymeric phase occupying the plurality of periodic recesses has an average height, $H_{avg}$, measured normal to the polishing surface from the base surface of the polishing layer toward the polishing surface; and, wherein an absolute value of a difference, ΔS, between the average thickness, $T_{P\text{-}avg}$, and the average height, $H_{avg}$, is ≤0.5 μm.

3. The chemical mechanical polishing pad of claim 2, wherein the continuous non-fugitive polymeric phase further comprises a plurality of hollow core polymeric materials; wherein the plurality of hollow core polymeric materials is incorporated in the continuous non-fugitive polymeric phase at 1 to 35 vol %.

4. The chemical mechanical polishing pad of claim 2, wherein the plurality of periodic recesses is a group of at least two concentric recesses and wherein the average recess depth, $D_{avg}$, of the at least two concentric recesses is ≥15 mils; and, wherein the at least two concentric recesses have a width of ≥5 mils and a pitch of ≥10 mils.

5. The chemical mechanical polishing pad of claim 2, wherein the plurality of periodic recesses is a group of at least two cross-hatched recesses.

6. The chemical mechanical polishing pad of claim 2, further comprising:
   at least one groove formed in the polishing layer at the polishing surface.

7. The chemical mechanical polishing pad of claim 6, wherein the at least one groove is a group of at least two concentric grooves.

8. The chemical mechanical polishing pad of claim 6, wherein the at least one groove is at least one spiral groove.

9. The chemical mechanical polishing pad of claim 6, wherein the at least one groove is provided in a cross hatch pattern.

10. A method of polishing a substrate, comprising:
providing a substrate selected from at least one of a magnetic substrate, an optical substrate and a semiconductor substrate;
providing a chemical mechanical polishing pad according to claim 1;
creating dynamic contact between a polishing surface of the polishing layer and the substrate to polish a surface of the substrate; and,
conditioning of the polishing surface with an abrasive conditioner.

* * * * *